(12) United States Patent
Avenas et al.

(10) Patent No.: US 8,766,433 B2
(45) Date of Patent: Jul. 1, 2014

(54) ELECTRONIC CHIP HAVING CHANNELS THROUGH WHICH A HEAT TRANSPORT COOLANT CAN FLOW, ELECTRONIC COMPONENTS AND COMMUNICATION ARM INCORPORATING SAID CHIP

(75) Inventors: Yvan Avenas, Poisat (FR); Jean-Christophe Crebier, Grenoble (FR); Julie Widiez, Grenoble (FR); Laurent Clavelier, Saint Egreve (FR); Kremena Vladimirova, Grenoble (FR)

(73) Assignees: Commissariat a l'energie atomique et aux energies alternatives, Paris (FR); Centre National de la Recherche Scientifique, Paris (FR); Institut Polytechnique de Grenoble, Grenoble (FR)

( * ) Notice: Subject to any disclaimer, the term of this patent is extended or adjusted under 35 U.S.C. 154(b) by 45 days.

(21) Appl. No.: 13/700,918

(22) PCT Filed: May 31, 2011

(86) PCT No.: PCT/EP2011/058994
§ 371 (c)(1),
(2), (4) Date: Feb. 13, 2013

(87) PCT Pub. No.: WO2011/151351
PCT Pub. Date: Dec. 8, 2011

(65) Prior Publication Data
US 2013/0146955 A1    Jun. 13, 2013

(30) Foreign Application Priority Data
Jun. 2, 2010  (FR) ..................................... 10 54315

(51) Int. Cl.
*H01L 23/34*    (2006.01)

(52) U.S. Cl.
USPC .... 257/713; 257/712; 257/714; 257/E23.097; 257/E23.098

(58) Field of Classification Search
USPC ................... 257/712–716, E23.097, E23.098
See application file for complete search history.

(56) References Cited

U.S. PATENT DOCUMENTS

| 7,928,563 | B2 * | 4/2011 | Bakir et al. .................... 257/713 |
| 2007/0117306 | A1 | 5/2007 | Oyamatsu |
| 2007/0126103 | A1 | 6/2007 | Shi |
| 2009/0057881 | A1 | 3/2009 | Arana et al. |
| 2009/0294954 | A1 | 12/2009 | Bakir |

FOREIGN PATENT DOCUMENTS

| EP | 1988572 | 11/2008 |
| JP | 2005085808 | 3/2005 |
| WO | 2005/089477 A2 | 9/2005 |
| WO | 2007/044577 A1 | 4/2007 |

* cited by examiner

*Primary Examiner* — Matthew E Warren
(74) *Attorney, Agent, or Firm* — Occhiuti & Rohlicek LLP

(57) ABSTRACT

The invention relates to an electronic chip, comprising: a semiconductor substrate (6) having an active area (8) formed by at least one P doped region and at least one N doped region which form one or more P-N junctions through which most of the useful current flows when said electronic chip is in a conductive state, and at least one channel (44) through which a heat transport coolant can flow, the channel(s) passing through at least said P or N doped region of the active area. Each channel (44) is rectilinear and passes through the substrate (6) in a direction which is collinear with a direction F to the nearest ±45°, where the direction F is perpendicular to the plane of the substrate.

17 Claims, 7 Drawing Sheets

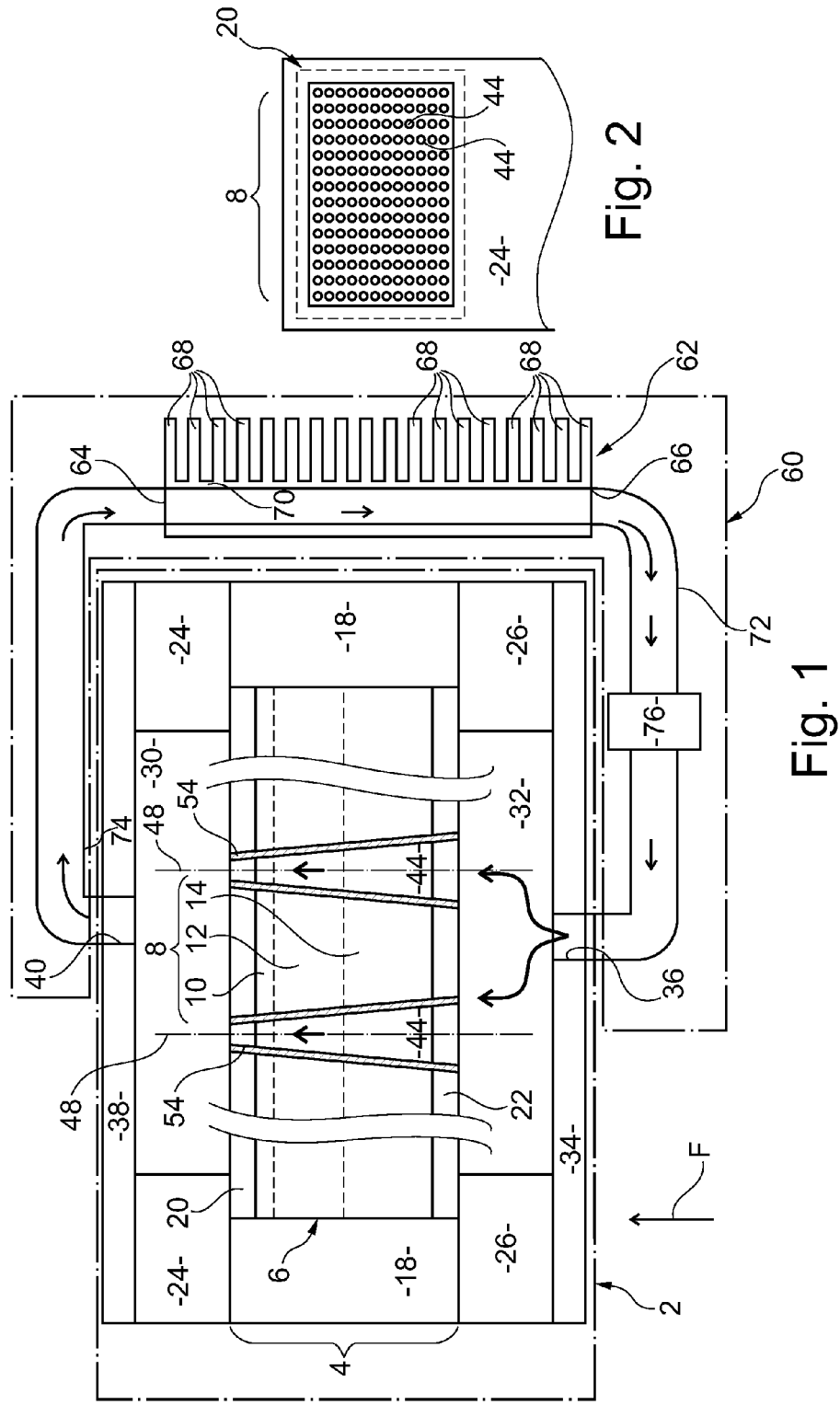

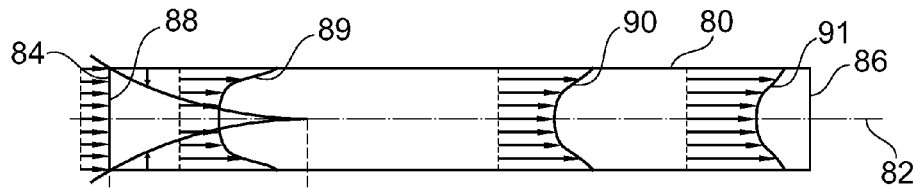
Fig. 3
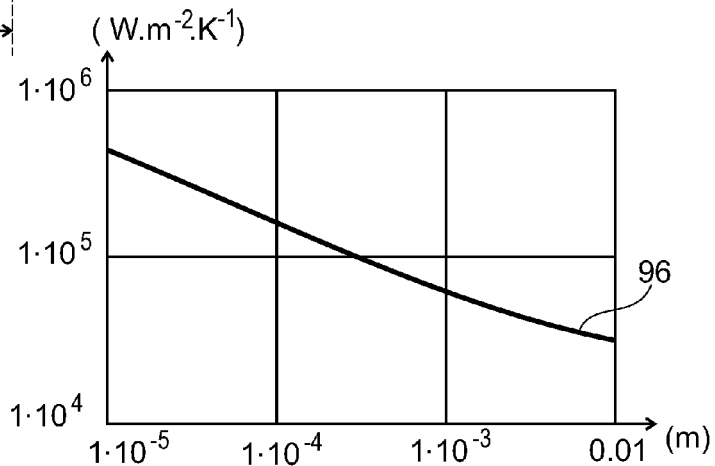
Fig. 4
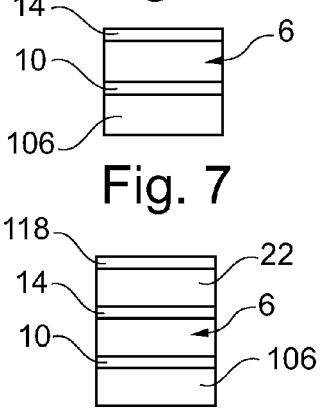
Fig. 5
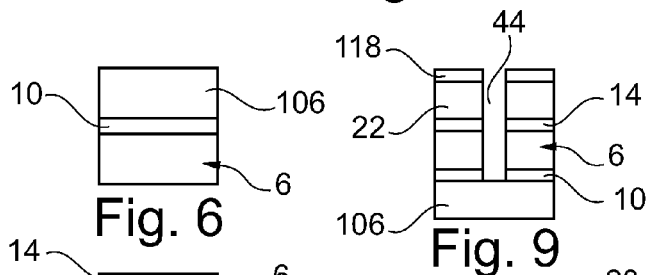
Fig. 6
Fig. 7
Fig. 8
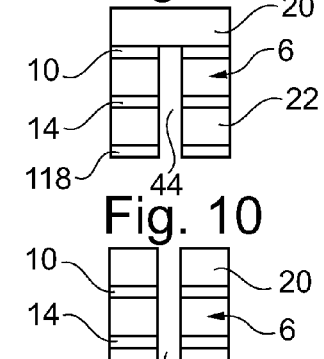
Fig. 9
Fig. 10
Fig. 11

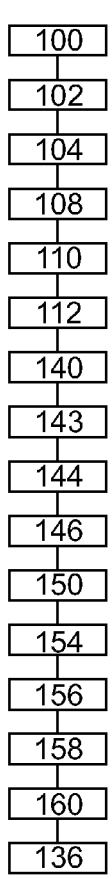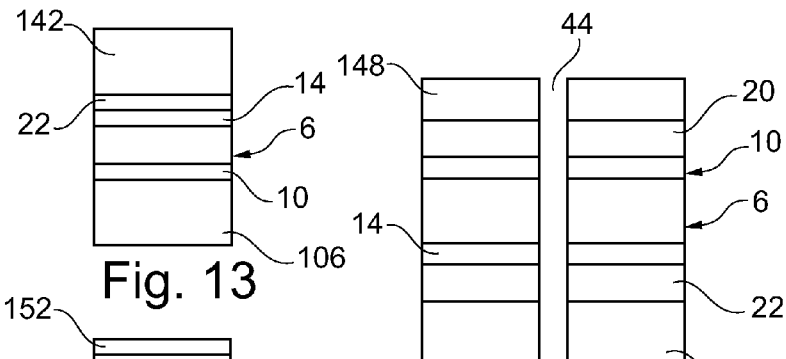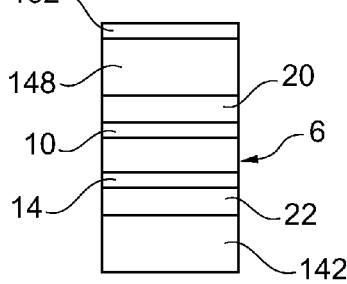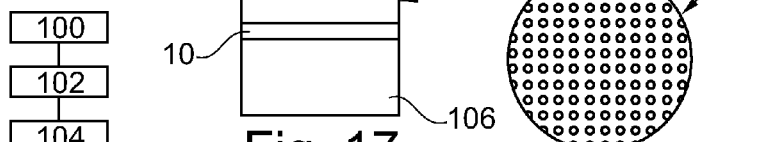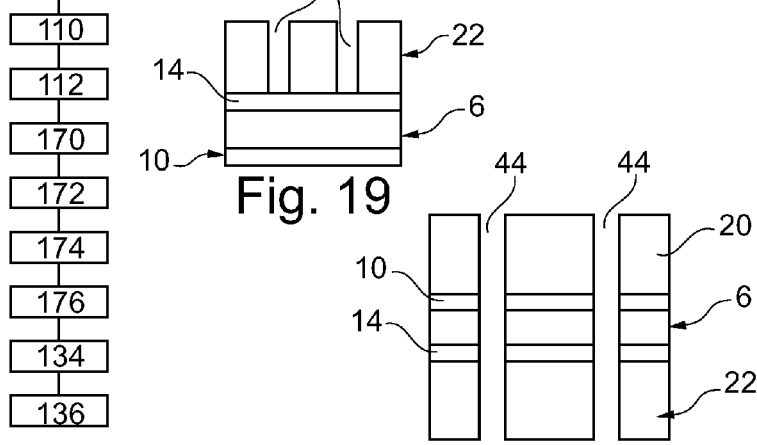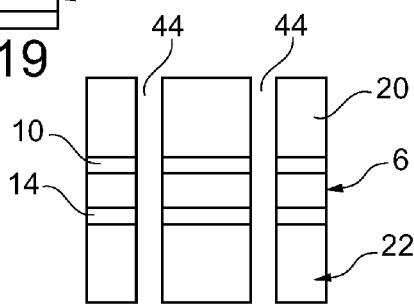

ELECTRONIC CHIP HAVING CHANNELS THROUGH WHICH A HEAT TRANSPORT COOLANT CAN FLOW, ELECTRONIC COMPONENTS AND COMMUNICATION ARM INCORPORATING SAID CHIP

CROSS-REFERENCE TO RELATED APPLICATIONS

This application is the National Stage of International Application No. PCT/EP2011/058994, filed May 31, 2001, which claims the benefit of the priority date of French Application No. 1054315, filed on Jun. 2, 2010. The content of these applications is hereby incorporated by reference in its entirety.

FIELD OF DISCLOSURE

The invention relates to an electronic chip and to an electronic component with a 3D structure incorporating this electronic chip. The invention also relates to another electronic component and to a switching arm incorporating this electronic chip.

BACKGROUND

An electronic component is a component taking the form of a package on the external face of which pins for connecting to an external electrical circuit are provided. Such a package comprises one or more electronic chips and electrical connections for connecting these one or more electronic chips to the connecting pins. The one or more electronic chips and the electrical connections are encapsulated in a given encapsulating material intended to protect them from the external environment. Typically, the encapsulating material is an electrically insulating polymer. Commonly, this encapsulating material also forms the external walls of the package.

Each electronic chip is a piece of a semiconductor substrate frequently called a wafer. These electronic chips are fabricated using wafer-scale microelectronic fabrication processes. These processes especially consist in depositing and etching layers in succession, one on top of the other, in order to "functionalize" the semiconductor substrate, i.e. to provide the electronic chip with the desired function.

Many of these chips act as controllable switches. This is because this is one of the basic functions of electronics. These electronic chips switch between an on state and an off state in response to a control signal. For this purpose, electronic chips generally comprise a semiconductor substrate essentially lying in a plane and having an active zone formed by at least one p-doped region and at least one n-doped region, which form one or more p-n junctions through which most of the useful current flows when this electronic chip is in an on state. The active zone is also called the drift region.

In the on state, the active zone has a low resistance to the useful current flow, which flows between at least two pins for connecting the electronic chip. In contrast, in the off or blocked state, the active zone has a much higher resistance to the useful current flow between the same connecting pins. Typically, the ratio U/J is higher than $1 \times 10^6$ $\Omega/cm^2$ and preferably higher than $1 \times 10^8$ $\Omega/cm^2$ in the off state, U being the voltage across the connecting pins and J being the current density flowing through the active zone. Ideally, the flow of useful current is completely stopped in the off state. In the on state the ratio U/J is lower than $1$ $\Omega/cm^2$ and preferably lower than $0.01$ $\Omega/cm^2$.

Switching between the on state and the off state can be controlled by a control signal delivered to a control electrode provided for this purpose. This control electrode is, for example, called a "gate" when the electronic chip is a field-effect transistor such as an IGBT (insulated gate bipolar transistor) or a MOS (metal oxide semiconductor) transistor, or a "base" in the case of a bipolar transistor, or even a "trigger" in the case of a thyristor. Switching between these two states may also only depend on the voltage applied across the connecting pins, as is the case for a diode. In the latter case, the control signal that makes the diode switch between the two on and off states is the voltage applied between its cathode and its anode.

Electronic chips are heated by Joule losses, which adversely affect their performance or limit their operating range, their current rating for example. The higher the product of the current and the voltage across the connecting pins, the greater the Joule heating. If no precautions are taken, Joule heating can destroy the electronic component, because of its temperature limits. Thus, it is almost essential to cool power electronic components, i.e. components capable of passing a useful current the density of which is higher than $1$ $A/cm^2$, and preferably higher than $100$ $A/cm^2$, for, for example, ten minutes or even a number of hours without being destroyed. Electronic chips and components are therefore frequently associated with a cooling circuit.

It has already been suggested to produce microchannels in at least part of one of the faces of the substrate of an electronic chip in a nonfunctional region of this chip. Microchannels are channels the largest transverse dimension of which is smaller than 500 µm and preferably smaller than 100 µm. Such microchannels are, for example, described in the following article:

Tuckerman D. B., Pease R. F. W., "*High Performance Heat Sinking For VLSI*", IEEE Electron Devices Letters, volume EDL-2-5, pages 126-129, 1981.

In most cases, these microchannels extend parallel to the plane of the substrate of the chip so as not to interfere with the zones through which current flows. However, recently, in the field of integrated circuits, it has been suggested to pass these microchannels through the substrate, perpendicular to the plane of the latter (see for example patent application US 2009/0294954). In the latter case, the microchannels are carefully placed to avoid the one or more active zones of the integrated circuit, through which zones useful current flows. This is because the active zones of an integrated circuit are extremely small (about a few nanometers to a few tens of nanometers square). Thus, if a microchannel were to pass through or touch this active zone the latter would disappear. The latter technique therefore requires, at the design stage of the integrated circuit, provision to be made for nonfunctional, from the electronic point of view, areas through which microchannels can pass. These nonfunctional areas increase the footprint of the chip and make its miniaturization more difficult.

At the present time, to improve electronic chips, more effective cooling of these electronic chips is required. Moreover, microchannels lying parallel to the substrate are long, thereby leading to substantial head loss and reducing the heat exchange coefficient between the heat-transfer fluid and the substrate.

In addition, instead of using microchannels, electrical tracks that supply and collect the useful current that flows through the active zone are also used to evacuate heat from, and therefore cool, the active zone.

Because the electrical tracks have this dual function, contacts between these electrical tracks and the active zone must not only have a high electrical conductivity but must also be good conductors of heat. To ensure good conduction of heat, these electrical connections are produced by soldering or by adhesive bonding or at very high pressures. In addition, they generally have a large area in order to reduce their thermal resistance. Thus, such contacts are good thermal and electrical conductors and generally provide the chip with mechanical strength, and they are mechanically stressed by temperature variations. This is because the substrate and the electrical tracks generally do not have the same thermal expansion coefficients and there is no degree of freedom between them.

The prior art also includes patent applications EP 1 988 572 A1, US 2007/117306 A1 and US 2007/126103 A1.

SUMMARY

The invention aims to overcome at least one of the above drawbacks. Thus, it relates to an electronic chip comprising at least one channel able to contain a flowing heat-transfer fluid, these one or more channels passing through at least said p- or n-doped region of the active zone. In addition, said at least one channel is rectilinear and passes right through the substrate in a direction collinear with a direction F to within ±45°, where the direction F is perpendicular to the plane of the substrate.

In the above electronic chip, the one or more channels pass through the active zone, i.e. the zone where most of the Joule heating occurs. Heat exchange between this electronic chip and the channels is thus more effective, because the latter are located much closer to the sources of the Joule heating. Thus, the cooling of the chip is improved.

Embodiments of this electronic chip may comprise one or more of the following features:
the chip comprises a first and a second metallization layer, which layers extend uniformly directly on respective opposite faces of the active zone so as to distribute the useful current in the cross section of the active zone, each metallization layer being permeable to the heat-transfer fluid, the latter flowing right through each metallization layer, in the one or more channels that open into the active zone;
the chip comprises more than one-hundred channels passing through the n- or p-doped region of the active zone;
the total cross-sectional area of the channels is at least less than a third of the area of the active zone;
the channel flares in the least doped region in the direction of travel from the most highly doped region to the least doped region;
the sidewalls of the channel are covered with a layer of dielectric material at least at the level where it crosses the intersection between two regions doped with different types;
the chip comprises at least one metallization layer that extends uniformly and directly over one face of the active zone, this metallization layer being permeable to the heat-transfer fluid that flows in the one or more channels that open into the active zone, and the thickness e of the metallization layer is such that the ratio ρ/e is less than 0.1 mΩ, where ρ is the electrical conductivity of the material from which the metallization layer is made;
the active zone is formed of a large p- or n-doped region in which elementary cells doped with the opposite type are produced in order to form multiple p-n junctions between which conductive gates are placed, these gates being able to switch the active zone between an on state and an off state, and each channel passes through or occupies the place of one elementary cell located between two gates;
the chip is a controllable switch able to switch, in response to a control signal, the active zone between an on state in which its resistance to current flow is low and an off state in which its resistance to current flow is at least ten times higher; and/or
the smallest hydraulic diameter of the one or more channels is between 1 and 500 µm.

Furthermore, these embodiments have the following advantages:
channels passing through the substrate perpendicular to its plane are shorter, thereby reducing head loss and increasing the heat exchange coefficient;
using more than one-hundred channels in parallel relative to the fluid flow allows the head loss to be greatly reduced while providing a larger heat exchange surface and makes it possible to negate the consequences of one of these channels being obstructed by debris;
ensuring that the total cross-sectional area of the channels is smaller than a third of the area of the active zone maintains or improves the electrical properties of the electronic chip without increasing, and perhaps even decreasing, the total area of its active zone;
using channels at least one portion of which flares in the most weakly doped region allows the concentration of electric field equipotential lines inside the heat-transfer fluid to be limited and reduces the electric field at the interface between the chip and the insulating material, thereby maintaining the breakdown voltage and relaxing constraints on the choice of heat-transfer fluid;
covering the sidewalls of the channel with a dielectric material at the level where the channel crosses the interface between regions doped with different types allows the breakdown voltage of the electronic chip to be maintained because narrowing of the electric field equipotential lines then mainly occurs in this dielectric material and no longer in the heat-transfer fluid;
using metallization layers the thickness e of which is such that the ratio ρ/e is lower than 0.1 mΩ allows the current to be more uniformly distributed in the active zone, thereby allowing the breakdown voltage of the electronic chip to be maintained, increasing the safety margin of the electronic component incorporating this chip, and stiffening the semiconductor; and
passing the channels between the gates means that there is no need to modify the layout of the conductive tracks that connect these gates.

The invention also relates to an electronic component comprising:
the chip described above, in which the chip comprises at least one metallization layer that extends uniformly directly over one face of the active zone, this metallization layer being permeable to the heat-transfer fluid that flows in the one or more channels that open into the active zone; and
at least one conductive track arranged only on the periphery of the active zone and making direct mechanical and electrical contact with the metallization layer so as to supply or collect the current that flows through this active zone when the electronic chip is in the on state.

Connecting the chip electrically only on the periphery of its active zone allows the propagation paths of current and heat to be decoupled, thereby making it possible to optimize the electrical connections.

Embodiments of this component may comprise one or more of the following features:
the electrical contact between the conductive track and the metallization layer consists only of a solderless and adhesive-free pressure-bonded contact that allows the electrical track to slide over the metallization layer in response to any temperature variation; and said at least one conductive track is a pin taking the form of a hollow tube of electrically conductive material, the periphery of which is electrically connected to the periphery of the active zone of the electronic chip, and the hollow of which is fluidically connected to said at least one channel that passes through the active zone.

Furthermore, the embodiments of this electronic component have the following advantages:

using pressure bonding to contact/connect the electrical track to the metallization layer allows this electrical track to slide over the metallization layer in response to a temperature variation without damaging the electronic chip;

the hollow tubular connecting pin simultaneously fills two roles, namely electrical and fluidic connection of the electronic chip, thereby simplifying production of the electronic component;

The invention also relates to an electronic component having a 3D structure.

This electronic component comprises:

at least one first and one second electronic chip, these electronic chips being of the type described above, each chip having an upper face and a lower face, these electronic chips being stacked one on top of the other such that the upper face of the first electronic chip faces the lower face of the second electronic chip, and upper ends of the one or more channels that open onto the upper face of the first electronic chip are fluidically connected to lower ends of the one or more channels that open onto the lower face of the second electronic chip.

The above 3D electronic component advantageously uses the channels to effectively dissipate heat within the stack of electronic chips itself. This improves the cooling of the stacked electronic chips and allows, for example, a new architecture to be envisioned for power electronic components.

Embodiments of this electronic component with a 3D structure may comprise one or more of the following features:

the upper and lower faces of the first and second chips define the upper and lower walls of an intermediate heat-transfer fluid manifold housed between the first and second electronic chips and into which the upper ends of the channels of the first electronic chip and the lower ends of the channels of the second electronic chip open;

the first and second electronic chips each comprise at least one metallization layer that extends uniformly directly over one face of the active zone, the lower and upper face respectively, this metallization layer being permeable to the heat-transfer fluid that flows in the one or more channels that open into the active zone, and at least one common conductive track arranged only on the periphery of the active zone of each chip and making direct mechanical and electrical contact with the metallization layers that extend over the lower face of the active zone of the first chip and over the upper face of the active zone of the second chip, so as to supply or collect the current that flows through these active zones.

Furthermore, the embodiments of these electronic components with a 3D structure have the following advantages:

the presence of a coolant fluid manifold housed between the first and second electronic chips allows the cooling of the electronic component to be improved and the pressure between the various channels that pass through a given electronic chip to be made uniform.

Finally, the invention relates to a switching arm comprising:

voltage input and output terminals;

at least two controllable switches connected in series between these input and output terminals, each controllable switch comprising the electronic chip described above; and at least one decoupling capacitor equipped with at least two electrodes electrically connected to the input and output terminals, respectively, and with a dielectric material that electrically insulates these two electrodes from each other, the decoupling capacitor comprising at least one channel that passes through the dielectric material between the electrodes, or that extends directly along at least one of the electrodes, these one or more channels being fluidically connected to the channels passing through the active zones of the electronic chips forming the controllable switches.

Cooling the capacitor using channels that are fluidically connected to the channels used to cool the controllable switches makes it possible to place this capacitor near these controllable switches without said capacitor becoming too hot as a result of this proximity. The amplitude of the overvoltages generated by the inductance of the electrical connection lines of this switching arm is therefore reduced by virtue of this proximity.

BRIEF DESCRIPTION OF THE FIGURES

The invention will be better understood on reading the following description, given merely by way of nonlimiting example and with reference to the drawings, in which:

FIG. 1 is a schematic partial illustration of an electronic component equipped with an electronic chip;

FIG. 2 is a top view of the upper face of the electronic chip;

FIG. 3 is a schematic illustration of the transverse temperature distribution inside a channel;

FIG. 4 is a graph illustrating the variation of the average heat exchange coefficient between a heat-transfer fluid flowing inside a channel, and the length of the channel;

FIG. 5 is a flow chart of a first process for fabricating the electronic chip of the electronic component shown in FIG. 1;

FIGS. 6 to 11 are schematic cross-sectional illustrations of various steps of the process shown in FIG. 5;

FIG. 12 is a flow chart of a second process for fabricating the electronic chip shown in FIG. 1;

FIGS. 13 to 15 are schematic cross-sectional illustrations of various steps of the process shown in FIG. 12;

FIG. 16 is a flow chart of a third process for fabricating the electronic chip shown in FIG. 1;

FIGS. 17, 19 and 20 are schematic cross-sectional illustrations of various steps of the fabrication process shown in FIG. 16;

FIG. 18 is a schematic top view of a permeable metallization layer used in the process shown in FIG. 16;

DETAILED DESCRIPTION

Figure 21:
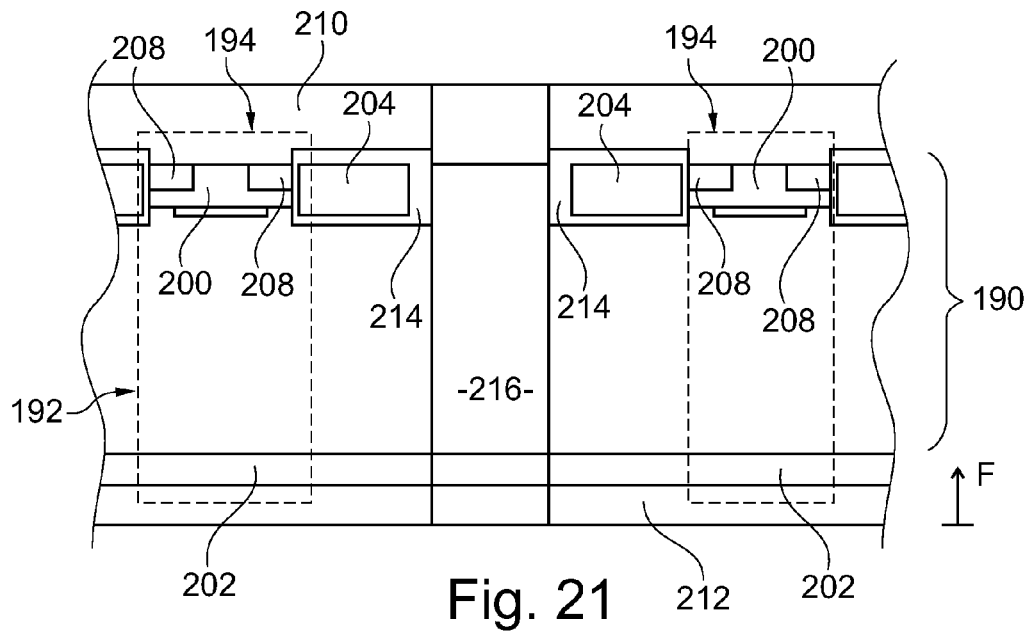
FIG. 21 is a schematic partial illustration of an electronic chip used to produce a MOSFET (metal oxide semiconductor field-effect transistor)

In these figures, the same references are used to denote the same elements.

In the rest of the description, features and functions that are well known to those skilled in the art are not described in detail.

In the rest of the description the terms "vertical" and "horizontal" are defined relative to the vertical direction F shown in FIG. 1. Similarly, the terms "lower" and "upper" refer to the parts of an element which are located toward the bottom, respectively toward the top, of said element, in the direction F.

FIG. 1 shows an electronic component 2 comprising an electronic chip 4 encapsulated in an encapsulating layer (not shown) made of an electrically insulating material. The encapsulating layer is for example made of an insulating polymer or a dielectric gel. This chip 4 is electrically connected to pins for connecting the component 2 by way of electrical tracks 24, 26. These electrical tracks are also encapsulated in the same encapsulating material.

More precisely, the rest of this description relates to the particular case where the chip 4 is a power electronic chip, i.e. capable of passing a useful current the density of which is higher than 1 A/cm$^2$ and, typically, higher than 50 or 100 A/cm$^2$.

To simplify the description, the chip 4 is described here for the particular case where said chip forms a power diode. More precisely, here the chip 4 is a p-i-n diode (i.e. a diode possessing, between two highly doped p$^+$ and n$^+$ regions, an almost intrinsic weakly doped region).

Here, this power diode is capable of withstanding, when it is reverse biased, a voltage of at least 50 volts, and preferably of at least 600 volts.

Such a diode passes no current, when it is reversed biased, until a threshold voltage, called the avalanche voltage, is reached. In the off state, only leakage currents flow, which are very much lower than the useful current that flows through the same diode when the latter is in the on state. This diode turns on when it is forward biased.

The chip 4 comprises a semiconductor substrate 6. This substrate is a piece of a wafer. For example, the substrate 6 is a semiconductor substrate made of silicon or gallium nitride (GaN) or of silicon carbide (SiC). In the rest of this description, the substrate 6 is assumed to be made of silicon. The substrate 6 essentially lies in a plane that is perpendicular to the direction F. The thickness of this substrate in the direction F is substantially uniform. This thickness is typically between 1 μm and 800 μm and preferably between 5 and 200 μm. Here the thickness of the substrate 6 is 110 μm. This substrate 6 has a flat upper face and a flat lower face.

In FIG. 1, the vertical wavy lines that transect the substrate 6 indicate that a large portion of the substrate 6 has not been shown in FIG. 1, for the sake of simplicity.

The substrate 6 comprises an active zone 8. The active zone 8 is the zone that switches between the on state and the off state. Most of the useful current passes through this zone in the on state and it holds the voltage in the off state. This zone 8 corresponds to the zone in which most of the Joule heating of the component 2 occurs.

In the particular case of an electronic power component, the area of the active zone perpendicular to the direction F is large, i.e. greater than 10 μm$^2$ and, preferably, greater than 100 or 500 μm$^2$ and indeed possibly even greater than 1 or 2 mm$^2$.

In order to allow switching between the on state and the off state, here the active zone is formed by a stack of one or more regions doped with different types, so as to form one or more p-n junctions. By virtue of these doped regions, the active zone 8 has asymmetric current-transfer properties.

Here, the active zone 8 comprises a highly p-doped region 10 located on a weakly n-doped region 12 itself located on a highly n-doped region 14. Conventionally, the doping of the regions 10, 12 and 14 is denoted p$^+$, n$^-$, and n$^+$, respectively. These regions of different doping are located one on top of the other in the direction F. In FIG. 1, these regions are separated by dashed lines. The p-n junction is formed by the regions 10 and 12. The region 14 essentially acts to make the lower face of the substrate 6 more conductive.

By way of example, the p-type dopant concentration in the region 10 is equal to $3 \times 10^{17}$ cm$^{-3}$. The n-type dopant concentration in the region 12 is, for example, equal to $2 \times 10^{14}$ cm$^{-3}$. The n-type dopant concentration in the region 14 is at least 1,000 or 10,000 times higher than the concentration in the region 12. For example, the n-type dopant concentration in the region 14 is equal to $5 \times 10^{19}$ cm$^{-3}$.

Here the regions 10, 12 and 14 extend over the entire width of the substrate 6, as far as the peripheral boundary of the p-n junction.

The region 10 forms the upper face of the substrate 6. Its thickness in the direction F is for example lower than 3 μm.

For example, the region 12 is between 3 and 250 μm in thickness in the direction F.

The region 14 is, for example, between 5 and 525 μm in thickness in the direction F.

The active zone 8 is encircled by a peripheral zone 18. The zone 18 is here designed to maximize the breakdown voltage of the chip 4, keeping it near that of a planar junction. The breakdown voltage is the voltage above which the chip starts to conduct even when the latter is controlled to remain in the off state. In the case of diodes, the breakdown voltage corresponds to the maximum reverse bias that may be applied to the diode without causing exponential growth in the current flowing through the diode, caused by excessive acceleration of free carriers crossing the depletion region. The useful current does not pass through the zone 18. Typically, only leakage currents will pass through the peripheral zone 18. The magnitude of these leakage currents is at least ten times lower than that of the useful current.

The peripheral boundary of the active zone is designed to enable electrical connection at the periphery of the component.

Here, the peripheral zone is made of a dielectric material. In addition, the interface between the active zone 8 and the peripheral zone 18 is designed in order to limit the concentration of electric field equipotential lines in this zone 18. This limits edge effects. Various solutions may be implemented such as the solutions described in sections 3.2 and 3.3 of the following document:

Philippe Leturck, <<Tenue en tension des semi-conducteurs de puissance>>, Techniques de l'ingénieur, Traité Génie électrique, B 3 104.

The upper and lower faces of the active zone 8 are covered with metallization layers, 20 and 22, respectively. These metallization layers are made of an electrically conductive material, i.e. the electrical conductivity of which is higher than $1 \times 10^5$ or $1 \times 10^6$ S.m$^{-1}$. Preferably, the material used to produce these layers 20, 22 is chosen to have a thermal expansion coefficient equal to that of the substrate 6, to within ±100%, without this criterion being restrictive. For example, the layers 20 and 22 are made of molybdenum or of tungsten if the substrate 6 is made of silicon or even of a CuMo, CuW, CuC or AlC alloy. They may also be made of copper.

These layers 20 and 22 cover the entire upper and lower faces of the active zone 8 so that the useful current is uniformly distributed in the entire cross section of the active zone. Preferably, these layers 20 and 22 do not extend beyond the periphery of the active zone 8. Their respective thickness e is here chosen so that the following criterion is respected: $\rho/e<0.1$ mΩ, where $\rho$ is the electrical conductivity of the material used to produce the layer 20 or 22.

Preferably, the thickness e of the layers 20, 22 is also chosen to stiffen the substrate 6 and to increase the heat capacity of the chip 4 and therefore to slow the variation in its temperature. Finally, these layers 20 and 22 may also be used to match the thermal expansion coefficient of the substrate 6 to that of the conductive tracks 24, 26 formed from the metallization layers.

For example, here the layers 20 and 22 are more than 5 μm in thickness, and preferably more than 10 or 100 μm in thickness.

The layer 20 corresponds to the anode of the diode whereas the layer 22 corresponds to its cathode.

The component 2 also comprises the conductive tracks, 24 and 26, making mechanical and electrical contact with the layers 20 and 22, respectively. These tracks 24 and 26 allow the anode and cathode, respectively, of the diode to be connected to pins that are connected to an electrical circuit external to the component 2. These tracks 24 and 26 are made of an electrically conductive material such as, for example, copper.

The tracks 24 and 26 only make mechanical and electrical contact with the external periphery of the layers 20 and 22 in order to leave the region of the upper and lower faces, respectively, of the layers 20 and 22 in line with the active zone 8, free.

Here, the contact between the tracks 24, 26 and the layers 20, 22 is designed to ensure good electrical conduction but not necessarily good thermal conduction. This contact also strengthens the chip. For example, the contact between the tracks 24, 26 and the layers 20, 22 is a low-pressure contact, i.e. an electric contact produced merely by pressing this track against the face of the corresponding metallization layer, with, for example, a pressure of less than 10 MPa. Pressure-bonded contacts use neither solder nor adhesive. In addition, they allow the track to slide over the face of the metallization layer with which it makes contact in response to a temperature variation. This type of contact therefore limits the mechanical stresses caused by temperature variations. As a result the chip 4 is made more robust.

The component 2 comprises manifolds 30, 32 that are shaped so that a heat-transfer fluid flows over the upper and lower faces, respectively, of the layers 20 and 22, in order to cool them.

The manifold 32 is a cavity the upper wall of which is defined by the lower face of the layer 22. The sidewalls of this manifold 32 are defined by the vertical faces of the track 26. Finally, the lower wall of this manifold 32 is defined by the upper face of a layer 34 of a dielectric material. This layer 34 comprises an inlet 36 allowing heat-transfer fluid to enter into the manifold 32.

Similarly, the manifold 30 corresponds to a cavity the lower wall of which is defined by the upper wall of the layer 20. The side wall of this cavity is defined by the vertical face of the track 24 and the upper wall is defined by a layer 38 made of a dielectric material. An outlet 40 for the heat-transfer fluid is produced in the layer 38.

Here, to cool the chip 4 as closely as possible to the zone in which the Joule heating occurs, the chip comprises microchannels 44 that pass through the active zone 8. In order to simplify FIG. 1, only two microchannels 44 have been shown.

These microchannels pass through the doped regions 10, 12 and 14 and therefore also pass through the p-n junction formed in the active zone 8.

To increase the density of microchannels per unit area in the active zone, the number of microchannels is made higher than 50, 100, 500 or 1000 microchannels per mm$^2$. Specifically, the higher the density of microchannels, the more effective the cooling is and the lower the head loss. In addition, using a large number of microchannels increases the robustness of the chip 4 with respect to dust or debris obstructing one of these microchannels. Specifically, the loss of one or more of these microchannels out of more than one thousand has a negligible effect on the operation of the cooling circuit of the chip 4 and the isotherm at its surface.

Preferably, the microchannels are rectilinear and pass right through the substrate 6 in a direction substantially parallel to the direction F. The expression "substantially parallel to" is understood to mean a direction that is collinear with the direction F to within ±45°. Choosing to produce the microchannels in such a direction makes it possible to reduce head loss because they are shorter than prior-art microchannels that extend parallel to the plane of the substrate. In addition, this increases the heat exchange coefficient because the length of the microchannels is sufficiently short for the flow of heat-transfer fluid to be in an unstable regime over most of the channel. The unstable regime is defined in greater detail with regard to FIG. 3.

In the particular case shown here, each microchannel 44 has an axis or a plane 48 of symmetry. This axis or plane of symmetry is parallel to the direction F.

Preferably, the hydraulic diameter D of these microchannels 44 is strictly smaller than $2D_t$, and preferably than $D_t$. The diameter $D_t$ is defined by the following relationship in the laminar flow regime: $D_t = L/(0.05 \, Re_D \times Pr)$, where $Re_D$ is the Reynolds number of the flow of heat-transfer fluid;

L is the length of the microchannel;

$D_t$ is the average hydraulic diameter of the microchannel over its entire length; and Pr is the Prandtl number.

When the microchannel 44 does not have a constant cross section over its entire length, the diameter D is the average of the hydraulic diameters of the microchannel over its entire length L.

The length L is set by the thickness of the chip 4, which is itself set by electrical considerations such as the voltage withstand desired for the chip 4.

In order to determine the Reynolds number $Re_D$, the heat-transfer fluid and the flow rate of this fluid in the microchannel taken into account are those encountered during normal use of the component 2. For example the flow rate is between 1 ml/minute and 10 l/minute, and preferably between 10 ml/minute and 2 l/minute, for example for a dissipated power of 100 W. Examples of heat-transfer fluids are given below.

Preferably, the total cross-sectional area of the microchannels is less than a third of the area of the active zone and, preferably, less than 25% or 10% of the area of the active zone. The expression "cross-sectional area" is here understood to mean the average cross-sectional area of a microchannel 44 along its entire length through the substrate 6.

Limiting the area occupied by the microchannels in this way at least compensates for the reduced performance of the chip 4 associated with the fact that its active zone 8 is deprived of the area required by the microchannels 44. Specifically, any reduction in the area of the active zone results, for example, in an increase in the current density, which may result in the density of losses in the chip 4 increasing. In contrast, the increase in the power density to be dissipated is here compensated for by better cooling, which, on the contrary, allows the maximum power that can be handled by the chip 4 to be increased. Thus, by limiting the total cross-sectional area of the microchannels to a third of the area of the active zone, it is possible to preserve the electrical characteristics of the electronic chip, and generally to improve them, without however increasing the area of the active zone, and even perhaps decreasing it, relative to the case where there are no microchannels passing through the active zone.

Here the microchannels 44 are arranged in the active zone in order to keep the temperature of the active zone substantially constant over its entire width and thus to ensure parallel isotherms at its upper face. The temperature is substantially constant if the difference between the hottest point and the coldest point is less than 1° C. For this purpose, for example, the microchannels 44 are uniformly arranged over the entire area of the active zone.

Preferably, each microchannel has a rectangular cross section.

Here, the smallest hydraulic diameter of each microchannel is smaller than 500 µm and, preferably, between 1 µm and 500 µm. Even more advantageously, the smallest hydraulic diameter is between 10 and 100 µm or between 50 and 100 µm.

Here, the microchannels also pass through the metallization layers 20 and 22. The layers 20 and 22 are thus made permeable to heat-transfer fluids. In addition, this extends the length of the microchannels and participates in the evacuation of heat by increasing the area of the heat exchange surface.

Preferably, the cross section of each microchannel flares at the region, in the voltage-holding zone, where the electric field increases, i.e. here the region 12, in the direction of travel from the most highly doped region of the p-n junction (here the region 10) to the least doped region (here the region 12). This flare in the cross section of each microchannel makes it possible to limit the concentration of electric field equipotential lines inside the heat-transfer fluid. Thus, the breakdown voltage of the chip 4 is maintained or even improved. This is because the breakdown voltage of a large volume of heat-transfer fluid is generally at least ten times lower than the breakdown voltage of the active zone 8. This flare makes it possible to distance the electric field equipotential lines from one another in the heat-transfer fluid. This effect, in combination with the small dimensions for which the dielectric strength of fluids greatly increases, reduces the risk that the breakdown voltage of the heat-transfer fluid will be exceeded. In this way the performance of the chip 4 is improved and the constraints on the choice of the heat-transfer fluid are relaxed.

Here the cross section of each microchannel flares continuously as the channel gets progressively deeper into the substrate 6 in the direction opposite to the direction F. The slope of this flare is greater than 10% and, preferably, greater than 25, 50 or 100%. The slope, as a percentage, is defined by the following relationship: $x\% = \text{Max}(r)/2L$, where:

Max(r) is the maximum width of the microchannel inside the substrate 6; and

L is the length of the microchannel through the substrate 6.

In this particular embodiment, again to improve or maintain the electrical performance, and especially the breakdown voltage, of the chip 4, a passivation layer 54 made of a dielectric material covers the internal sidewalls of the microchannels, at least at the level where the microchannel crosses the interface between two regions doped with different types. Specifically, the electric field equipotential lines tend to concentrate in the heat-transfer fluid, especially at interfaces between two regions doped with different types. Thus, applying the passivation layer 54 in this location ensures that the electric field equipotential lines are no longer concentrated in the heat-transfer fluid but in the dielectric material forming the layer 54. The layer 54 has a breakdown voltage that is at least ten times higher than that of the heat-transfer fluid. Thus the breakdown voltage of the chip 4 is therefore improved.

The breakdown voltage of the heat-transfer fluid may be measured according to US standard ASTM D1816 or D3300 or European standard CEI60156 and according to US standard ASTM D149 for solids.

For example, the layer 54 is made of $SiO_2$ if the substrate is made of silicon and of $Si_3N_4$ if the substrate is made of gallium nitride.

In the particular case shown, the layer 54 extends uniformly over the entire length of each microchannel, through the substrate 6 and the layers 20 and 22.

The chip 4 has many advantages and in particular it disassociates the electrical flux from the main heat flux. Here, the main heat flux, allowing cooling of the active zone 8, is vertical and passes through the middle of the active zone. In contrast, the electrical flux is confined to the periphery of the active zone 8. It will therefore be understood that when an electrical contact is formed, it is no longer also necessary to attempt to produce a good thermal contact since the heat flux is essentially evacuated by way of the microchannels and not by way of the conductive tracks 24 and 26.

The component 2 is associated with a cooling circuit 60. This circuit 60 comprises a heat exchanger 62 allowing the heat-transfer fluid to be cooled. This exchanger 62 comprises an inlet 64 and an outlet 66 for the heat-transfer fluid.

For example, the exchanger 62 is a finned radiator that evacuates heat from the heat-transfer fluid to the ambient air. Here, this exchanger comprises fins 68 that extend from a base 70 pierced with one or more channels in which the heat-transfer fluid flows between the inlet 64 and the outlet 66. Here, this radiator is made out of a material having a very good thermal conductivity, i.e. a thermal conductivity higher than $10\,\text{Wm}^{-1}\text{K}^{-1}$ and preferably higher than $100\,\text{Wm}^{-1}\text{K}^{-1}$. For example, this exchanger is made of aluminum or copper.

The circuit 60 also comprises ducts 72 and 74, respectively for supplying and collecting the heat-transfer fluid. The duct 72 is connected between the outlet 66 and the inlet 36 whereas the duct 74 is connected between the outlet 40 and the inlet 64.

The circuit 60 also comprises a pump 76 that makes the heat-transfer fluid flow from the exchanger 62 to the microchannels 44 and from the microchannels to the inlet 64.

Finally, an expansion vessel is provided in the circuit 60. This expansion vessel is for example an air pocket.

In FIG. 1, arrows indicate the flow direction of the heat-transfer fluid inside the circuit 60 and the microchannels 44 and 46.

The heat-transfer fluid is here a dielectric heat-transfer fluid, i.e. the electrical conductivity of which is lower than 0.1 S.m$^{-1}$ and preferably lower than 1×10$^{-5}$ or 1×10$^{-6}$ S.m$^{-1}$. Its relative permittivity $\epsilon_r$ is strictly higher than 1 and also, preferably, lower than 10 or 20. The lower the relative permittivity of the heat-transfer fluid, the lower the maximum electric field observed therein.

The heat-transfer fluid is for example deionized water or an oil. For example, the oil sold under the trade name "Coolanol"® by Exxon Mobil® may be used.

The heat-transfer fluid is also chosen to be chemically compatible with those materials of the component 2 with which it makes direct contact and, in particular, those of the chip 4. For example, the heat-transfer fluid must be as inert as possible.

During operation of the circuit 60, the pump is turned on in order to make the heat-transfer fluid flow from the exchanger 62 to the manifold 32. From the collector 32, the heat-transfer fluid passes through the active zone 8 by way of the microchannels and opens into the collector 30. The duct 74 returns the heated heat-transfer fluid from the manifold 30 to the exchanger 62, so that it can be cooled again.

FIG. 2 shows the upper face of the track 24. The dotted line in FIG. 2 describes the outline of the layer 20. The circles on the upper face of the layer 20 represent the emerging orifices of the microchannels 44.

As illustrated, the track 24 makes mechanical and electrical contact with the metallization layer 20 over most of its external periphery without obstructing the microchannels 44. In the particular case shown, the track 24 makes direct mechanical and electrical contact with the entire external periphery of the layer 20. The track 26 is identically arranged with respect to the layer 22.

FIG. 3 shows a channel 80 that extends along a horizontal axis 82 of symmetry. This channel 80 possesses an end 84 through which a fluid enters, and an end 86 through which this fluid exits. The curves 88 to 91 illustrate the temperature profile in a cross section of the fluid, which is made to flow through the channel 80. Initially, at the inlet end, the temperature of the fluid is the same over its entire cross section. The curve 88 is therefore rectilinear and the arrows illustrating the temperature as a function of distance from the internal wall of the channel 80 are all the same length. As the fluid progresses through the channel 80, the fluid making contact with the internal wall of the channel 80 is heated more rapidly that the fluid located on the axis 82, as the curve 89 shows. After a length $L_t$ measured from the end 84, the temperature profile reaches a stable regime and stops changing, as the curves 90 and 91 show, only the length of the arrows increasing as the cross section moves closer to the outlet 86.

The length that a cross-sectional slice of fluid must travel from the end 84 before its temperature profile stabilizes is denoted $L_t$. The flow regime is said to be "thermally unstable" over the entire length $L_t$. In contrast, the flow regime is said to be "thermally stable" beyond the length $L_t$.

When the flow regime is thermally unstable, the temperature difference between the wall of the channel 80 and the heat-transfer fluid making contact with this wall is larger than when the regime is stable. Thus, the heat exchange coefficient is better. It will therefore be understood that choosing the hydraulic diameter D of the microchannel so that its length L is less than $2L_t$ and preferably, than $L_t$ allows the heat exchange coefficient between the heat-transfer fluid and the substrate 6 to be improved. The length $L_t$ is given by the formula $L_t=0.05\ Re_D\times D\times Pr$ introduced above, for laminar flow.

The graph in FIG. 4 shows (curve 96) the variation of the heat exchange coefficient of a microchannel as a function of its length. In this graph, the X-axis and the Y-axis respectively represent the length L of the channel and the heat exchange coefficient. It may be seen that reducing the length of the microchannels greatly increases the average heat exchange coefficient and therefore the effectiveness of the cooling.

FIG. 5 shows a first process for fabricating the chip 4 in the particular case where the latter is a power diode.

Initially, in a step 100, the substrate 6 is provided. This substrate is, for example, thick, i.e. it is more than 200 µm in thickness. Here it is less than 750 µm in thickness. The substrate is lightly and uniformly doped, so as to form the region 12. For the sake of simplicity, the region 12 has not been shown in FIGS. 6 to 11.

Next, in a step 102, the doped region 10 is produced on one face of this substrate.

In a step 104, a carrier 106 (FIG. 6) is bonded to the upper face of the region 10 opposite the substrate 6. In this example, the carrier is an oxidized silicon wafer or a silicon wafer with an oxide deposited on its surface. The oxide allows this carrier to be bonded to the silicon substrate. The bonding is strong enough to allow the following steps to be carried out, while remaining easy to debond at the appropriate time.

In a step 108, the assembly shown in FIG. 6 is flipped using the carrier 106.

Optionally, in a step 110, the substrate 6 is then thinned. For example, its thickness may be reduced to less than 200 µm or 110 µm.

Next, in a step 112 (FIG. 7), the face of the substrate 6 opposite the carrier 106 is doped to form the region 14.

In a step 114, the metallization layer 22 is added to the face of the region 14 opposite the carrier 106. The layer 22 is, for example, a metal sheet (of Cu, Mo, W, MoCu, etc.) that is more than 200 µm in thickness, or a silicon sheet on which a layer of a controlled thickness of metal has been deposited beforehand. In the latter case, the metal layer may be very thin (i.e. less than 200 µm in thickness) and about a few tens of microns in thickness. The silicon sheet is, for its part, more than 200 µm in thickness. For example, the metallization layer is bonded using a process such as direct, eutectic or thermocompression bonding. The layer 22 may also be electrodeposited directly on the region 14. In this case it is thinner being 10 to 50 µm in thickness.

In a step 116, a hard mask 118 (FIG. 8) is deposited on the face of the layer 22 opposite the carrier 106. This hard mask is for example made of SiO$_2$ or of resist or Si$_3$N$_4$.

In a step 120, the hard mask 118 is etched, for example by photolithography, in order to define the locations where the microchannels 44 must be produced.

In a step 122, the etching of the microchannels 44 is started. To do this, the layer 22 is etched through the hard mask 118. For example, the layer 22 is etched using a plasma etch for a refractory material.

In a step 124, the etching of the microchannels 44 in the layer 22 continues so that these channels also pass through the substrate 6 and in particular the regions 10 and 14 (FIG. 9). For example, in this step, a DRIE (deep reactive ion etching) process is used. For the sake of simplicity, a limited number (only one or two) of microchannels 44 have been shown in FIGS. 9 to 11.

In a step 126, the handle 106 is removed, for example by grinding and chemical etching. The chemical etching may be carried out with tetramethylammonium hydroxide (TMAH) to remove the silicon and hydrofluoric acid (HF) to remove the oxide.

In a step 128, the metallization layer 20 is added in place of the carrier 106 on the upper face of the region 10. The metallization layer 20 is, for example, bonded to this upper face (FIG. 10). In this case, the layer 20 is typically more than 200 µm in thickness.

In a step 130, the etching of the microchannels 44 continues so that they also pass through the metallization layer 20. Once the etching of the microchannels has finished, the layer 118 is removed (FIG. 11).

Next, in a step 134, the substrate 6 is diced so as to separate the various chips 4 fabricated simultaneously thereon, in order to singulate these chips.

Afterwards, in a step 136, the various elements required to obtain the component 2 are added to the chip 4. In particular, in step 136, the tracks 24 and 26 are deposited or added to the periphery of the metallization layers 20 and 22.

Still in step 136, each chip 4 is encapsulated in an encapsulating material so as to protect it from the external environment in order to obtain the component 2. During the encapsulation, the microchannels are protected so as not to be obstructed.

FIG. 12 shows a second process for fabricating the component 2 and more particularly the chip 4. This process is similar to the preceding process except that the microchannels are etched in a single step after the carrier 106 has been removed. This process is used, for example, when the metallization layer is made of a deposited metal layer that is thinner than a metal sheet.

This process will be described with regard to FIGS. 13 to 15, which show particular steps of this process.

Only the steps of the process in FIG. 12 that are different to those in FIG. 5 are described in detail here. More precisely, this process starts with steps 100 to 112 described above.

Step 112 is followed by a step 140. In step 140, a sheet 142 (FIG. 13) made of a conductive material or a semiconductor comprising the metallization layer 22 on its lower face is produced then bonded to the region 14. In this case, the layer 22 may be very thin (i.e. less than 200 µm in thickness) and about a few tens of microns in thickness. The layer 142 is for example made of silicon.

In a step 143, the assembly shown in FIG. 13 is flipped.

Next, in a step 144, the carrier 106 is removed and a substrate 148 (FIG. 14) on which the metallization layer 20 is deposited is bonded to the region 10. Similarly, this process makes it easy to make the layer 20 very thin, about a few tens of microns in thickness.

Next, in a step 150, a hard mask 152 (FIG. 14) is deposited on the substrate 148 on the side opposite the layer 20. In this step 150, the hard mask is etched, for example by photolithography, in order to define the locations where the microchannels 44 must be produced.

In a step 154, the hard mask 152 is used to produce the microchannels 44. In this step 154 deep RIE etching is for example employed.

In a step 156, the layers 20 and 22 are etched using a process such as a plasma etch for a refractory material.

In a step 158, the mask 152 is removed. The structure shown in FIG. 15 is then obtained.

In a step 160, the substrates 142 and 148 are etched to form the conductive tracks 24 and 26, respectively.

Next, the process continues with step 136, except that the tracks 24 and 26 have already been produced.

FIG. 16 shows a third process for fabricating the component 2 and more precisely the chip 4. FIGS. 17 to 20 show various steps of this process in more detail.

This process starts with steps 100 to 112 described above with regard to FIG. 5.

After step 112, in a step 170, the metallization layer 22 is added to the region 14 (FIG. 17). The layer 22 is for example bonded to the region 14. In this embodiment, the layer 22 is a holed metal sheet, i.e. a sheet pierced with a multitude of through holes, each hole corresponding to the end of one microchannel 44. FIG. 18 shows a top view of the layer 22 bonded to the region 14.

Next, in a step 172, the microchannels of the chip 4 are etched using the through holes of the layer 22 as a mask.

In a step 174, the carrier 106 is removed (FIG. 19) and then the assembly is flipped.

In a step 176, the holed metallization layer 20, pierced beforehand with a multitude of through holes, is added to the region 10. In this step 176, the through holes of the layer 20 are aligned with the microchannels 44 that emerge in the region 10. The electronic chip shown in FIG. 20 is thus obtained.

The following steps are the same as those described with regard to FIG. 5.

Up till now the microchannels have been described in the particular case of a power diode. However, these microchannels may be produced through the active zones of other electronic components, and in particular other power electronic components such as power transistors or LEDs.

Figure 22:
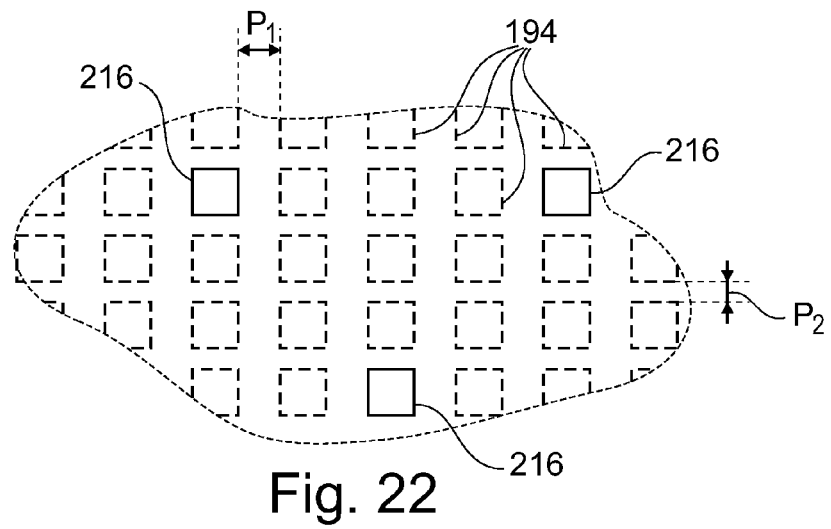
FIG. 22 is a schematic partial top view of a number of elementary cells of the MOSFET in FIG. 21.

FIGS. 21 and 22 show a portion of an active zone 190 of a power transistor. The power transistor is for example a MOSFET. Here, the active zone 190 is described for the particular case where the gates are "buried" gates.

This active zone 190 comprises a semiconductor substrate 192 in which a multitude of identical conductive cells 194 have been produced. For the sake of simplicity, only two MOS cells 194 have been shown in FIG. 21.

Each cell 194 is formed by a p-doped region 200 and an $n^+$-doped region 202. The region 202 is for example common to all the cells 194 and extends over the entire lower face of the active zone 190. In contrast, the regions 200 are separated from one another by intercellular regions, in which gates 204 are deposited.

Each region 200 also comprises two subregions 208 doped $n^+$. Each of the regions 200 and 208 make direct contact with a metallization layer 210 that is, for example, made of aluminum. Similarly, a metallization layer 212 is deposited under the region 202. The layer 210 forms the source of the transistor whereas the layer 212 forms the drain of this transistor.

The gates 204 located between two cells are electrically insulated from these cells and from the layer 210 by an electrical insulator 214.

The MOS cells are uniformly distributed over the entire active zone 190. For example, the cells 194 are regularly spaced in two nonparallel directions with respective spacings $p_1$ and $p_2$, so as to form an array of cells 194 (FIG. 22). The cross section of each cell 194 is for example a square with a 20 µm side length. Thus, in the case of a power transistor, the active zone comprises several thousand elementary cells per $cm^2$.

Microchannels 216 pass right through the active zone 190 parallel to a direction F that is itself perpendicular to the plane in which the substrate 192 essentially lies.

In this embodiment, these microchannels 216 replace a single cell 194, i.e. they take up the space between two gates 204.

Preferably, as in the preceding embodiment, the microchannels 216 are uniformly arranged in the active zone 190.

Each microchannel 216 is substituted for one of these elementary cells. However, since the number of elementary cells is very much higher than the number of microchannels 216, replacing a few of these elementary cells with microchannels 216 does not adversely affect the operation of the power transistor. On the contrary, the reduction in the size of the active zone 190 is largely compensated for by the improvement in the cooling of this active zone 190.

Figure 23:
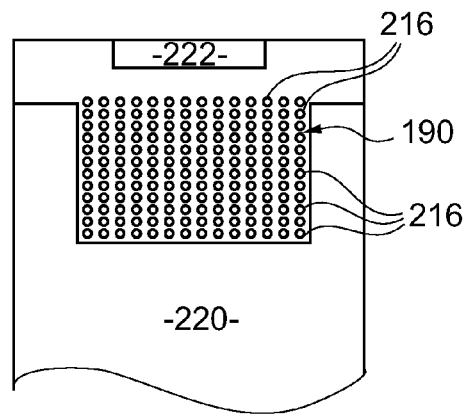
FIG. 23 is a schematic partial top view of the location of the conductive tracks with respect to the active zone of the electronic chip shown in FIG. 21.

FIG. 23 shows a top view of an electric track 220 making mechanical and electrical contact with most of the circumference of the layer 210 in which the microchannels are produced 216. In this view, the various gates 204 are also connected to a track 222.

Figure 24:
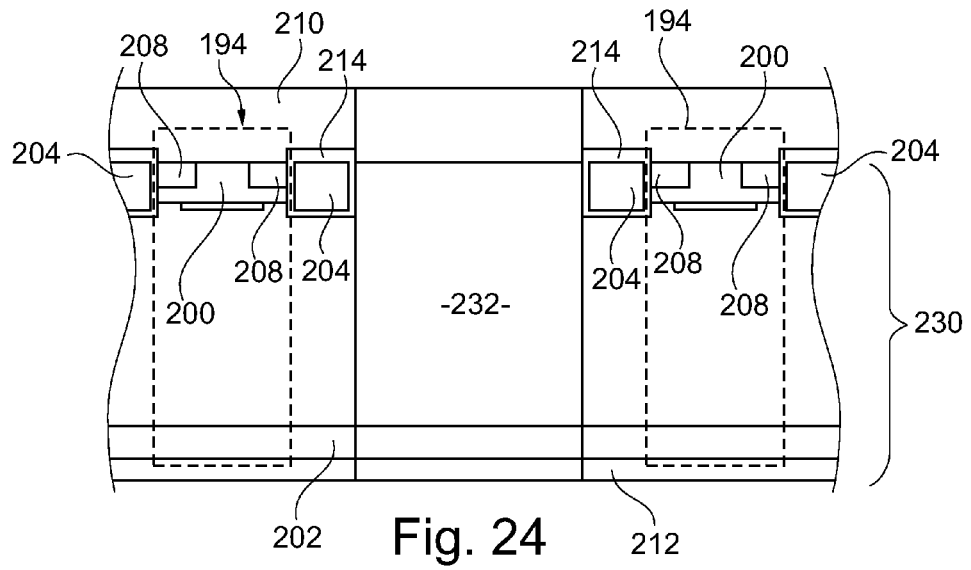
FIG. 24 is a schematic cross-sectional illustration of another embodiment of the chip shown in FIG. 21.

FIG. 24 shows another embodiment of an active zone 230 of a power transistor. The active zone 230 is identical to the active zone 190 except that the microchannels 216 are replaced by microchannels 232. The cross section of the microchannel 232 is larger than that of a cell 194. It therefore trims a portion of the gates 204 located on either side of the cell 194 replaced by the microchannel 232.

Figure 25:
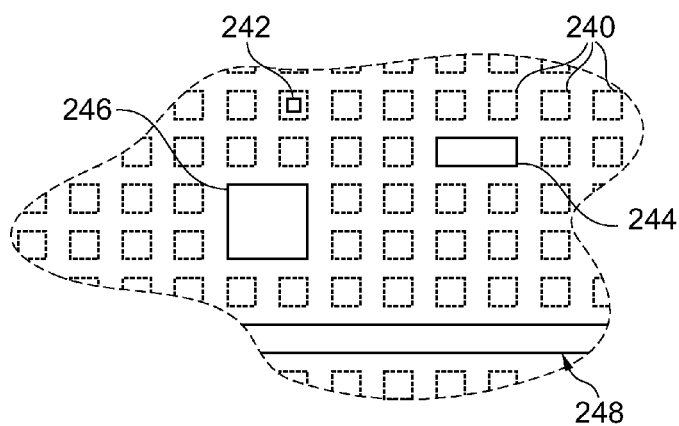
FIG. 25 is a partial top view of various possible ways in which the channels may be arranged in the chips shown in FIGS. 21 and 24.

FIG. 25 shows various possible microchannel embodiments, produced in an electronic component having an active zone the structure of which is similar to the active zones 190 and 230. In this figure, the squares drawn with dashed lines represent elementary MOS cells 240.

In a first embodiment, the cross section of a microchannel 242 is smaller than that of the elementary MOS cell through which it passes.

In a second embodiment, the cross section of a microchannel 244 extends over a plurality of cells 240. For example, the microchannel 244 replaces two elementary cells 240.

In a third embodiment, a microchannel 246 replaces a plurality of cells 240 in two orthogonal directions. Here for example, the microchannel 246 replaces a square of four cells 240.

Finally, in a fourth embodiment, the cross section of a microchannel 248 replaces a whole line or column of cells 240.

Just one of these microchannel embodiments alone may be applied to an electronic component, or in contrast these various embodiments may be combined in a given active zone.

Figure 26:
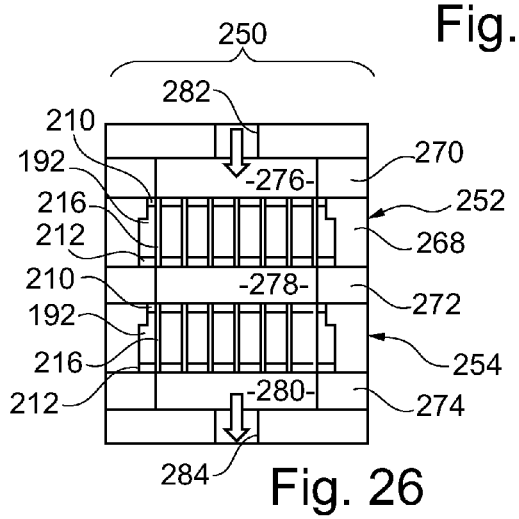
FIGS. 26 and 27 show schematic vertical cross sections through two different embodiments of an electronic component with a 3D structure using the electronic chips of FIGS. 21 and 24.

FIG. 26 shows an electronic component 250 with what is called a "3D" structure. An electronic component with a 3D structure is a component comprising a plurality of electronic chips stacked one on top of the other and contained in the same package. Stacking electronic chips one on top of the other improves electromagnetic compatibility. However, stacking electronic chips one on top of the other within a given electronic component causes particularly critical problems with respect to cooling. This is because zones located between these electronic chips are difficult to access and therefore particularly difficult to cool.

Here, the electronic component 250 is described in the particular case where it is a switching arm, an inverter arm for example. Such a switching arm is formed by two controllable switches connected in series by way of a midpoint. Here, each controllable switch is produced in a respective electronic chip 252, 254.

The chips 252 and 254 are each produced in the same way as that described above with regard to FIGS. 21 to 25. The latter are not described in greater detail here.

The chip 252 is stacked on the chip 254. Its source 210 is connected to a conductive track 270.

The drain 212 of the chip 252 and the source 210 of the chip 254 are electrically connected to the same electrical track 272, which forms the midpoint of the switching arm.

The drain 212 of the chip 254 is connected to the electrical track 274.

As shown in FIG. 21, the microchannels 216 emerge on both sides of each chip into manifolds 276, 278 and 280.

The manifold 278 is located between the chips 252 and 254 and is intermediate between the substrates 192 of each of these chips. The heat-transfer fluid enters the manifold 276 by way of an orifice 282, whereas the heat-transfer fluid heated by the chips 252 and 254 exits the manifold 280 by way of an orifice 284.

In this embodiment, the microchannels 216 that pass through the chips 252 and 254 are aligned with one another.

Assembling the chips 252 and 254 in this way makes it possible to obtain a 3D electrical component that is cooled effectively. Therefore, the advantage of improved electromagnetic compatibility is obtained without the drawbacks of ineffective cooling.

Figure 27:
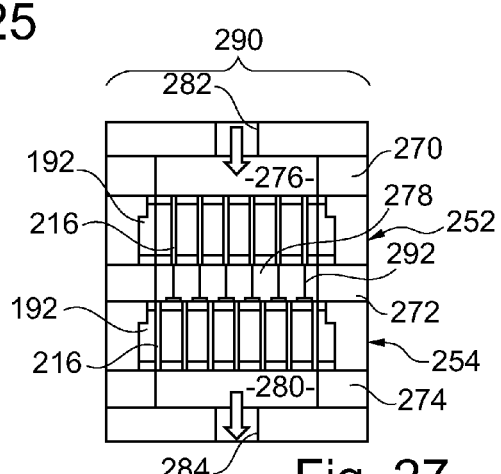

FIG. 27 shows a 3D electrical component 290 that is identical to the component 250, except that the microchannels of the chips 252 and 254 are not aligned, one set facing the other set. Thus, the microchannels 216 of the chip 252 produce a jet 292 that strikes the upper face of the metallization layer 210 of the chip 254. This jet makes the cooling more effective.

In FIGS. 26 and 27, the arrows show the flow direction of the heat-transfer fluid.

Figure 28:
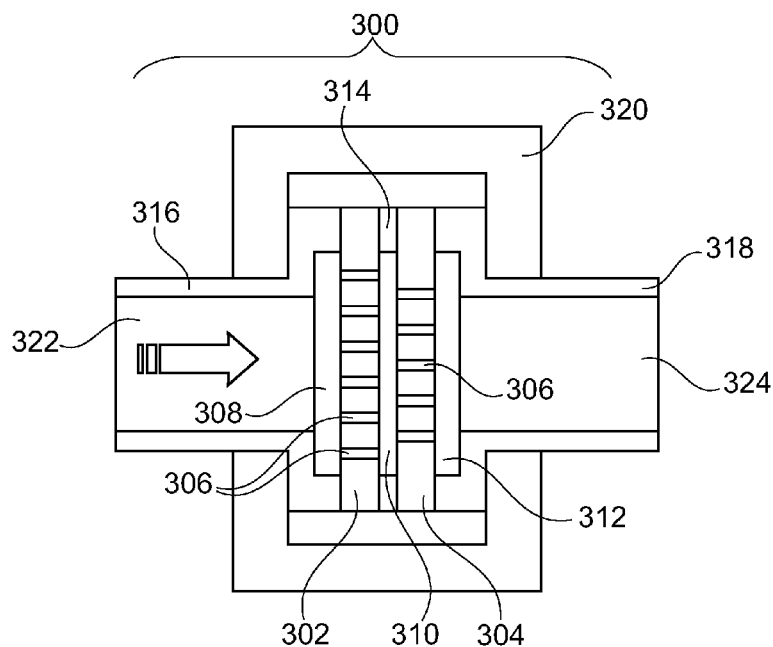
FIG. 28 is a schematic illustration of an electronic component incorporating one or more electronic chips such as that shown in FIG. 1.

FIG. 28 shows an electronic component 300 comprising two electronic chips 302, 304 stacked one on top of the other. These chips 302, 304 are produced according to the teachings given above and are therefore, in particular, transected by microchannels 306. The microchannels 306 of the chip 302 emerge on one side into an inlet manifold 308 and on the other side into an intermediate manifold 310. The microchannels 306 of the chip 304 emerge on one side into the intermediate chamber 310 and on the other side into an outlet manifold 312.

The chips 302 and 304 are electrically connected in series by way of their external periphery. For this purpose, an electrical track 314 connects the external periphery of the chip 302 to the external periphery of the chip 304 located directly below.

The component 300 also comprises a track 316 for supplying electrical current and a track 318 for collecting the electrical current. These tracks 316 and 318 have ends that form pins that protrude out of a polymer package 320 that encapsulates the chips 302 and 304 and the various manifolds.

The track 316 is electrically connected to the periphery of the active zone of the chip 302 whereas the track 318 is electrically connected to the periphery of the active zone of the chip 304. These tracks 316 and 318 therefore ensure the electrical connection of the chips 302 and 304 to an electrical circuit external to the package 320.

Here, these tracks 316 and 318 have been hollowed out to form a hollow tube. The track 316 has a hollow 322 that is fluidically connected to the inlet manifold 308 whereas the track 318 has a hollow 324 that is fluidically connected to the outlet manifold 312.

In FIG. 28, the arrow inside the hollow 322 shows the flow direction of the heat-transfer fluid.

Thus, in this embodiment, the electrical connection pins of the electronic chips also act as ducts that fluidically connect the microchannels 306 to a cooling circuit external to the package 320.

Figure 29:
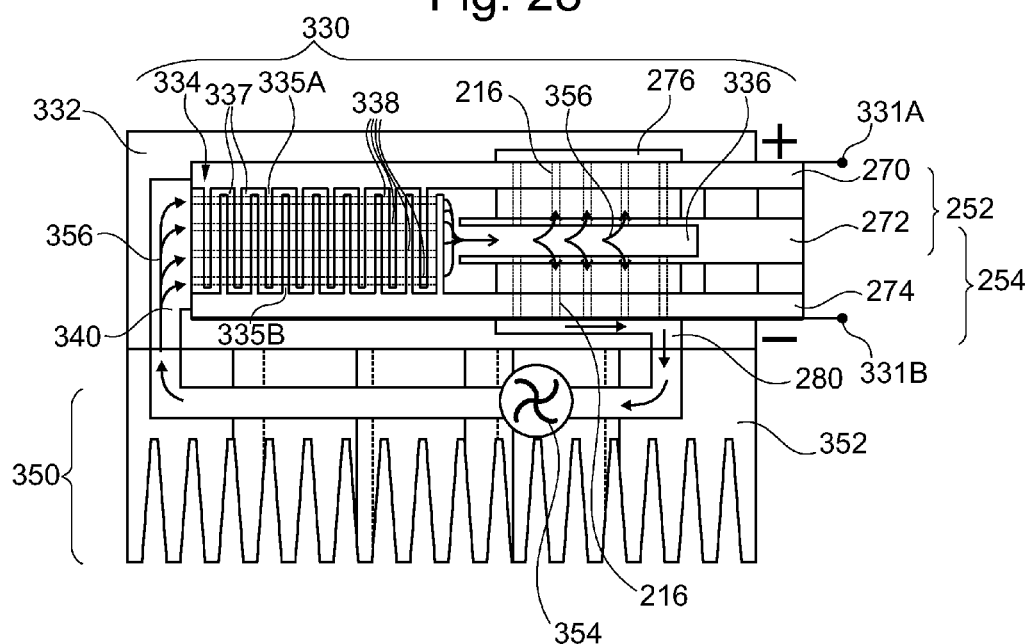
FIG. 29 is a schematic illustration of an integrated switching arm.

FIG. 29 shows a switching arm 330 that is electrically connected between input and output voltage pins 331A and 331 B. This arm is for example identical to the arm 250, except that it incorporates inside a polymer package 332 not only the chips 252 and 254 stacked one on top of the other but also a decoupling capacitor 334. In addition, in the arm 330, the chamber 278 is replaced by a manifold 336 that opens onto a face of the capacitor 334.

The capacitor 334 is typically formed by two conductive combs 335A and 335B that face each other and are electrically isolated from each other by a dielectric material 337. The capacitor 334 is transected by a multitude of microchannels 338. These microchannels 338 emerge on one side into the chamber 336 and on the other side into an inlet manifold 340. Here, these microchannels 338 pass through the combs 335A, 335B and the dielectric material 337.

The inlet manifold 340 and the outlet manifold 280 are fluidically connected to a cooling circuit 350. The circuit 350 comprises a heat exchanger 352 and a pump 354. The heat exchanger 352 is for example a radiator that allows the heat-exchange fluid expelled from the manifold 280 to be cooled before it is reinjected into the chamber 340. The pump 354 makes the heat-transfer fluid flow through the cooling circuit. Here the flow of heat-transfer fluid is represented by arrows 356.

The capacitor 334 is connected between the tracks 270 and 274 near the chips, so as to eliminate overvoltages during switching of the chips 252 and 254, these overvoltages being caused by the parasitic inductances of the electrical conductors connecting the component 330 to a voltage source. Here the voltage is applied between two terminals 331A, 331B that are electrically connected to the tracks 270, 274, respectively.

The microchannels of the capacitor 354 are fluidically connected to the microchannels 216 of the chips 252 and 254 so as to receive the heat-transfer fluid before the chips 252, 254. Thus, the capacitor 334 may be placed as close as possible to the switches, which improves overvoltage filtering. In addition, by virtue of the microchannels, the capacitor can function even though it is very close to the chips 252 and 254 because it is kept cool, i.e. its temperature remains below 100° C. or 80° C. In addition, in this embodiment, the cooling circuit is integrated into the electronic component 330, i.e. it is included in the same package 332.

Figure 30:
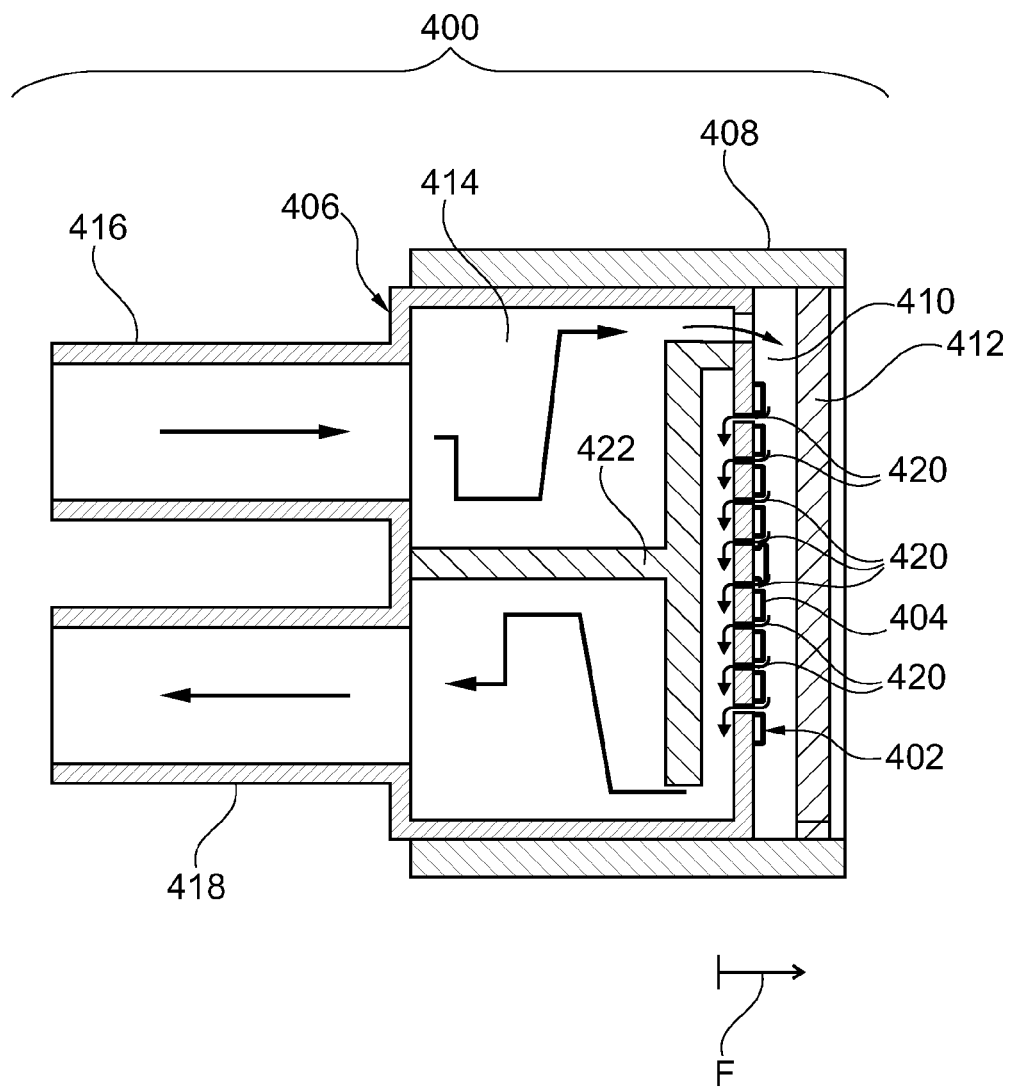
FIG. 30 is a schematic illustration of a packaged LED (light-emitting diode) lamp.

FIG. 30 shows a lamp 400. The lamp 400 is an electronic component that transforms part of the electrical power that it is supplied with into photons and therefore light. For this purpose, the lamp 400 comprises a semiconductor substrate 402 in which one or more LEDs (light-emitting diodes) 404 are produced. LEDs are well known and only information relating to the cooling of the active zones of the LEDs is given here. For more information on the other features of the lamp 400 described here, the reader may refer to patent application WO 2005/089477.

Each LED 404 comprises an active zone mainly formed by a p-n junction the role of which is to generate photons when the useful current is made to flow through the active zone. This active zone, similarly to the active zones described above, switches between an on state and an off state in response to a control signal. Here, as for the diode in FIG. 1, the control signal is the voltage applied across the terminals of the lamp 400. However, in contrast to electronic components used as switches, in the off state the LED can only hold a small voltage, for example about a few volts.

The LEDs 404 are mounted in a package 406 that includes a cover 408 used to enclose the substrate 402 hermetically inside a cavity 410. The cover 408 comprises a window 412. The window 412 may comprise optical elements, such as an array of diffractive or reflective elements, for collecting and collimating the light emitted by each LED onto a surface. The substrate 402 is mounted inside the cavity 410 so that its upper and lower faces are exposed to a heat-transfer fluid 414 that flows through the cavity 410. In FIG. 30, the flow direction of the fluid 414 is shown by arrows.

In this embodiment, the fluid 414 enters into the cavity 410 by way of an inlet channel 416 and exits from this cavity via an outlet channel 418.

As in the preceding embodiments, microchannels 420 pass through the active zone of each LED substantially perpendicular to the plane of the substrate 402.

Finally, the lamp 400 also comprises a wall 422 shaped in order to make the fluid 414 flow through the active zone of the LED by way of the microchannels 420. Thus the cooling of each LED is improved.

Many other embodiments are possible. For example a different type of heat exchanger, other than a radiator, could be used. In particular, the heat exchanger could be a heat exchanger that exchanges heat between the heat-transfer fluid, on the one hand, and an ambient liquid, on the other.

The layer passivating the sidewalls of the microchannels may be omitted.

The flare in the cross section of the microchannels may also be omitted.

The cross section of the microchannels may be ten, one-hundred or one-thousand times longer than it is wide.

The electronic chip may be any type of controllable switch such as a diode, MOS transistor, GTO transistor, a thyristor, a HEMT (high electron mobility transistor), a triac, etc. It may also be an LED.

The chips may be made of silicon or gallium nitride or of other semiconductors.

For each electronic chip, the dopant type may be reversed. Thus regions doped n-type may be replaced with regions doped p-type and vice versa.

When the cross section of the microchannel flares, the largest dimension of the cross section of the microchannel may increase linearly or in contrast nonlinearly, for example exponentially. The flare in the largest dimension of the cross section of the microchannel may also be stepped or only part of the length of the microchannel may be flared.

The microchannels may be nonuniformly arranged in the active zone. For example, the density of microchannels may be greater in a specific region of the active zone known to get hotter than other regions. The expression "density of microchannels" is understood to mean the number of microchannels passing through the active zone per $cm^2$.

The passivation layer may only be applied to the region where the microchannel crosses the interface between two regions doped with different types.

The peripheral zone encircling the active zone may be omitted if the voltages involved are sufficiently low.

The metallization layers may be produced using porous metallization layers obtained by depositing, on the upper and lower faces of the active zone, a permeable material, free of channels, extending only in one direction perpendicular to the plane of the substrate. This permeable material is, for example, a granular material. Such a granular material is, for example, formed by a multitude of small grains of a conductive material, which grains make electrical contact with one another. Gaps exist between these grains, through which the heat-transfer fluid can flow in order to pass right through the metallization layer. For example, the granular material is a copper frit. The permeable material may also be a foam, such as an iron foam, or a fiber.

The hydraulic diameter of the holes produced in the metallization layer to make it permeable to the heat-transfer fluid may be larger than the hydraulic diameter of the microchannels passing through the active zone.

The metallization layers and the electrical tracks making contact with these layers may be formed from the same block of material. A metal layer having the thickness of the electrical tracks is, for example, deposited on the active zone and its periphery. The part of this electrical track in line with the active zone is pierced with microchannels that extend, through these tracks, the microchannels that pass through the active zone, so as to make them emerge onto the external face of the metal layer on the side opposite the substrate.

The contact between the tracks 24, 26 and the layers 20, 22 may also be sunk or flush, by soldering or brazing.

As a variant, the track 24 or 26 is made of one or more bonding wires that electrically connect the metallization layer to other electrical tracks. These bonding wires are for example made of aluminum or gold. Preferably, they connect the upper metallization layer (for example the layer 20) to electrical tracks etched in a substrate on which the chip is placed.

As a variant, the microchannel passes right through the gate.

The above description also applies to transistors having gates that are not buried.

When the substrate is sufficiently thick, for reasons relating to its electrical properties, there is no need to use a carrier in the process for fabricating the chips.

The steps of bonding metallization layers may be replaced by steps of depositing electrically conductive materials. These materials are, for example, deposited by electrolysis.

The above description applies to a lateral power component, having all its electrodes on the same side of the substrate.

The teaching disclosed here also applies to electronic components comprising a plurality of electronic chips placed one beside the other in the same plane. For example, in this case, one end of the microchannels of each chip emerges into a common inlet manifold, and the other end of the microchannels of each chip emerges into a common outlet manifold.

A 3D electronic component, such as described with regard to FIGS. 26, 27 and 28, is not necessarily made up only of transistors. It may be produced by stacking any type of electronic chip (such as a diode, a thyristor, etc.) one on top of the other.

As a variant, the microchannels 338 run along the face of the electrodes of the decoupling capacitor but do not pass through these electrodes or the dielectric material present between these electrodes. The cooling circuit of the decoupling capacitor may also be fluidically independent of that of the controllable switches.

The heat-transfer fluid may be a dielectric liquid or a dielectric gas. The liquid or gas may be used at a high pressure.

The heat-transfer fluid does not need to be a dielectric if an electrically insulating layer is used to electrically insulate the conductive materials of the chip.

The heat-transfer fluid may flow in the direction indicated in the figures or in the opposite direction.

The heat-transfer fluid may be used, in certain particular cases, to heat the electronic chip.

The invention claimed is:

1. A manufacture comprising a first electronic chip, said first electronic chip comprising a semiconductor substrate lying essentially in a substrate plane and having an active zone formed by at least one p-doped region and at least one n-doped region that together form one or more pn junctions through which most useful current flows when said first electronic chip is in an "on" state, and a channel set comprising a channel for containing a flowing heat-transfer fluid, said channel passing through at least one of said p-doped region and said n-doped region of said active zone, wherein said channel is rectilinear and passes right through said semiconductor substrate in a direction that is within 45 degrees of being collinear with a first direction that is perpendicular to the substrate plane.

2. The manufacture of claim 1, wherein said first electronic chip comprises a first metallization layer and a second metallization layer that extend uniformly directly on respective opposite faces of said active zone so as to distribute said useful current in a cross-section of said active zone, each metallization layer being permeable to said heat-transfer fluid, said heat-transfer fluid flowing through said first and second metallization layers in said channel, said channel being open into said active zone.

3. The manufacture of claim 1, wherein said channel set comprises more than one-hundred channels passing through said n-doped region or said p-doped region of said active zone.

4. The manufacture of claim 3, wherein said active zone comprises an active-zone area and wherein said more than one-hundred channels have a total cross-sectional area that is less than a third of said active-zone area.

5. The manufacture of claim 1, wherein said channel flares in a least-doped region in a direction of travel from a most-highly-doped region to said least-doped region.

6. The manufacture of claim 1, wherein said channel comprises a sidewall, said sidewall being covered with a layer of dielectric material at least at a level at which said sidewall crosses an intersection between two regions, wherein said two regions comprise a p-doped region and an n-doped region.

7. The manufacture of claim 2, wherein a thickness of said first metallization layer is such that a ratio of electrical conductivity of a material from which said first metallization layer is made to said thickness is less than 0.1 mΩ.

8. The manufacture of claim 1, wherein said active zone is formed of one of a large p-doped region and n-doped region in which elementary cells doped with the opposite type are produced in order to form multiple pn junctions between which conductive gates are placed, said conductive gates being configured to switch said active zone between an "on" state and an "off" state, and wherein each channel passes through or occupies a place of one elementary cell located between a pair of said conductive gates.

9. The manufacture of claim 1, wherein said first electronic chip is a controllable switch, wherein said controllable switch, in response to a control signal, switches said active zone between an "on" state, in which a resistance of said active zone to current flow is low, and an "off" state, in which said resistance of said active zone to current flow is at least ten times higher.

10. The manufacture of claim 1, wherein said channel set comprises a channel having a smallest hydraulic diameter, said smallest hydraulic diameter being between 1 and 500 μM.

11. The manufacture of claim 1, further comprising an electronic component of which said first electronic chip is a constituent element, wherein said first electronic chip further comprises a metallization layer that extends uniformly directly over one face of said active zone, said metallization layer being permeable to heat-transfer fluid flowing through one or more channels that open up into said active zone, and a conductive track arranged only on a periphery of said active zone and making direct mechanical and electrical contact with said metallization layer so as to supply or collect current that flows through said active zone when said first electronic chip is in an "on" state.

12. The manufacture of claim 11, wherein said electrical contact between said conductive track and said metallization layer consists only of a solderless and adhesive-free pressure-bonded contact that allows said electrical track to slide over said metallization layer in response to any temperature variation.

13. The manufacture of claim 11, wherein said conductive track a pin taking the form of a hollow tube of electrically conductive material, a periphery of which is electrically connected to said periphery of said active zone, and wherein a hollow of said pin is in fluid communication with a channel that passes through said active zone.

14. The manufacture of claim 1, further comprising an electronic component with a 3D structure of which said first electronic chip and a second electronic chip are constituent elements, wherein each of said first and second electronic chips comprises an upper face and a lower face, said first and second electronic chips being stacked one on top of the other such that said upper face of said first electronic chip faces said lower face of said second electronic chip, wherein said second electronic chip comprises a semiconductor substrate lying essentially in a substrate plane and having an active zone formed by at least one p-doped region and at least one n-doped region that together form one or more pn junctions through which most useful current flows when said first electronic chip is in an "on" state, and a channel set comprising a channel for containing a flowing heat-transfer fluid, said channel passing through at least one of said p-doped region and said n-doped region of said active zone, wherein said channel is rectilinear and passes right through said semiconductor substrate in a direction that is within 45 degrees of being collinear with a first direction that is perpendicular to the substrate plane, wherein upper ends of channels that open onto said upper face of said first electronic chip are in fluid communication with lower ends of channels that open onto said lower face of said second electronic chip.

15. The manufacture of claim 14, wherein said upper and lower faces of said first and second electronic chips define upper and lower walls of an intermediate heat-transfer fluid manifold housed between said first and second electronic chips and into which an upper end of said channel of said first electronic chip and a lower end of said channel of said second electronic chip open.

16. The manufacture of claim 14, wherein said first and second electronic chips each comprise a metallization layer that extends uniformly directly over one face of said active zone, and said lower and upper face respectively, said metallization layer being permeable to heat-transfer fluid that flows in said channels that open into said active zone, and a common conductive track arranged only on a periphery of an active zone of each of said first and second electronic chips and making direct mechanical and electrical contact with metallization layers that extend over said lower face of said active zone of said first chip and over said upper face of said active zone of said second chip so as to supply or collect current that flows through these active zones.

17. The manufacture of claim 1, further comprising a second electronic switch, a switching arm comprising voltage input and output terminals, and two controllable switches connected in series between said input and output terminals, each of which has an electronic chip as a constituent element thereof, and a decoupling capacitor equipped with two electrodes electrically connected to said voltage input and output terminals, respectively, and with a dielectric material that electrically insulates said two electrodes from each other, wherein said decoupling capacitor comprises at least one of a channel that passes through said dielectric material between said electrodes and a channel that extends directly along at least one of said electrodes, said channel being in fluid communication with channels passing through active zones of said electronic chips forming said controllable switches, wherein said second chip comprises a semiconductor substrate lying essentially in a substrate plane and having an active zone formed by at least one p-doped region and at least one n-doped region that together form one or more pn junctions through which most useful current flows when said first electronic chip is in an "on" state, and a channel set comprising a channel for containing a flowing heat-transfer fluid, said channel passing through at least one of said p-doped region and said n-doped region of said active zone, wherein said channel is rectilinear and passes right right through said semiconductor substrate in a direction that is within 45 degrees of being collinear with a first direction that is perpendicular to the substrate plane.

* * * * *